United States Patent [19]

Nakatani et al.

[11] Patent Number: 5,065,066
[45] Date of Patent: Nov. 12, 1991

[54] PIEZOELECTRIC RESONATOR

[75] Inventors: Hiroshi Nakatani; Masao Gamo, both of Nagaokakyo, Japan

[73] Assignee: Murata Mfg. Co., Ltd., Japan

[21] Appl. No.: 554,783

[22] Filed: Jul. 18, 1990

[30] Foreign Application Priority Data

Jul. 19, 1989 [JP] Japan .................. 1-186777
Jul. 19, 1989 [JP] Japan .................. 1-186778

[51] Int. Cl.$^5$ .................................. H01L 41/08
[52] U.S. Cl. ...................... 310/320; 310/358; 310/359; 310/366
[58] Field of Search ............ 310/320, 358, 359, 365, 310/366

[56] References Cited

U.S. PATENT DOCUMENTS

| | | | |
|---|---|---|---|
| 4,066,986 | 1/1978 | Takano et al. | 310/320 |
| 4,196,407 | 4/1980 | Masaie et al. | 310/366 |
| 4,900,970 | 2/1990 | Ando et al. | 310/366 |
| 4,918,350 | 4/1990 | Ando et al. | 310/366 |

FOREIGN PATENT DOCUMENTS

| | | | |
|---|---|---|---|
| 0069914 | 6/1981 | Japan | 310/365 |
| 0221211 | 9/1987 | Japan | 310/320 |

Primary Examiner—Mark O. Budd
Assistant Examiner—Thomas M. Dougherty
Attorney, Agent, or Firm—Ostrolenk, Faber, Gerb & Soffen

[57] ABSTRACT

A piezoelectric resonator of an energy-trapped type utilizing a second harmonic wave of the thickness-extensional vibration mode, in which an inner electrode is formed in a position at a height around the center of a piezoelectric substrate in the direction of thickness, outer electrodes are formed on both major surfaces of the piezoelectric substrate so as to be opposed to the inner electrode through a piezoelectric substrate portion, and the dimension of at least one of the outer electrodes in the direction of the length of the inner electrode is made smaller than the dimension of the outer electrode in the direction of the width of the inner electrode.

10 Claims, 4 Drawing Sheets

PIEZOELECTRIC RESONATOR

BACKGROUND OF THE INVENTION

1. Field of the Invention

The present invention relates generally to piezoelectric resonators, and more particularly, to a piezoelectric resonator utilizing a second harmonic wave of the thickness-extensional vibration mode.

2. Description of the Prior Art

FIG. 7 is an exploded perspective view for explaining a conventional piezoelectric resonator utilizing a second harmonic wave of the thickness-extensional vibration mode. This piezoelectric resonator 50 has a piezoelectric substrate 53 formed by laminating a pair of ceramic green sheets 51 and 52 and sintering the same. A stripe-shaped inner electrode 54 extended in one direction is provided inside of the piezoelectric substrate 53. In addition, circular or polygonal outer electrodes 55 and 56 are formed on both outside major surfaces of the piezoelectric substrate 53 so as to be opposed to the inner electrode 54. The outer electrode 56 is illustrated in a frame represented by a broken line obtained by projecting the lower surface of the ceramic green sheet 52.

As shown in FIG. 7, in the conventional piezoelectric resonator 50 utilizing a second harmonic wave, the dimension of each of the outer electrodes 55 and 56 in the direction of the length of the inner electrode 54 is made equal to that in the direction of the width thereof.

FIG. 8 shows frequency-impedance characteristics of the conventional piezoelectric resonator 50 shown in FIG. 7. In FIG. 8, the ordinate represents an impedance Z and the abscissa represents a frequency f.

As shown in FIG. 8, the conventional piezoelectric resonator 50 has the disadvantage that a spurious mode S occurs on the side of a slightly higher frequency region from an antiresonance point A, thereby causing characteristics of the resonator to be degraded.

SUMMARY OF THE INVENTION

Accordingly, an object of the present invention is to provide a piezoelectric resonator utilizing a second harmonic wave of the thickness-extensional vibration mode having such a structure that the spurious mode which occurred on the side of a slightly higher frequency region from an antiresonance point can be suppressed in the impedance-frequency characteristics of the resonator.

According to the present invention, there is provided a piezoelectric resonator utilizing a second harmonic wave of the thickness-extensional vibration mode, which comprises a piezoelectric substrate, an inner electrode formed so as to extend in one direction in a position at a height around the center of the piezoelectric substrate in the direction of thickness, and outer electrodes formed on both major surfaces of the piezoelectric substrate so as to be opposed to the inner electrode, the dimension of at least one of the above outer electrodes in the direction of the length of the inner electrode being made smaller than the dimension thereof in the direction of the width of the inner electrode.

In the piezoelectric resonator according to the present invention, the inner electrode is arranged in a position at a height around the center of the piezoelectric substrate in the direction of thickness and the outer electrodes are provided on both major surfaces of the piezoelectric substrate so as to be opposed to the inner electrode. Accordingly, the second harmonic wave of the thickness-extensional vibration mode is excited. At least one of the outer electrodes has such a shape that the length thereof in the direction of the length of the inner electrode is smaller than the length thereof in the direction of the width of the inner electrode, thereby to make it possible to suppress the spurious mode which appeared in the vicinity of the antiresonance point in the impedance-frequency characteristics of the conventional piezoelectric resonator. Consequently, it becomes possible to obtain a piezoelectric resonator in which the unnecessary spurious mode is reduced and which utilizes a second harmonic wave of the thickness-extensional vibration mode exhibiting superior impedance-frequency characteristics.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
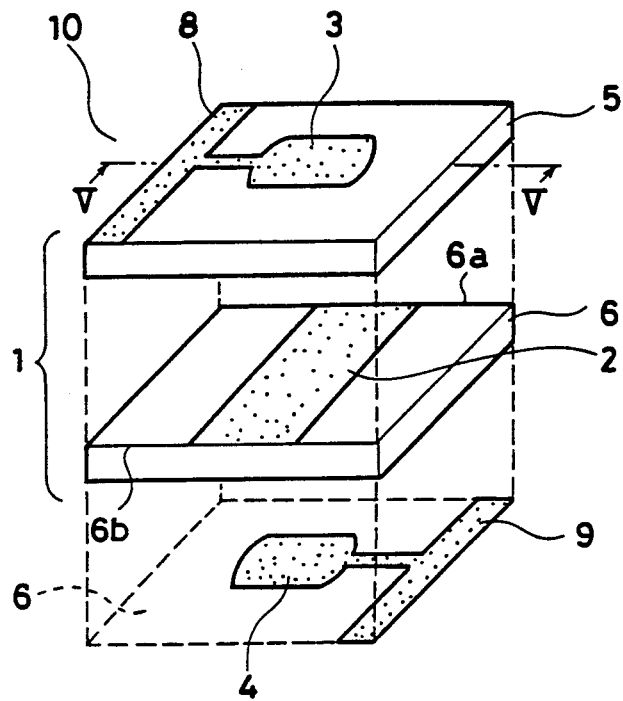
FIG. 1 is an exploded perspective view for explaining a piezoelectric resonator according to a first embodiment of the present invention, which shows a state where electrode patterns are formed on ceramic green sheets.

FIG. 1 is an exploded perspective view for explaining a piezoelectric resonator according to one embodiment of the present invention. Referring to FIG. 1, a pair of ceramic green sheets 5 and 6 are used so as to construct the piezoelectric resonator according to the present embodiment. The ceramic green sheets 5 and 6 are laminated and then, sintered to form a piezoelectric substrate 1, as described below.

An outer electrode 3 and a leading electrode 8 are formed on the upper surface of one ceramic green sheet 5 of the pair of ceramic green sheets 5 and 6 by printing conductive pastes. In addition, a rectangular stripe-shaped inner electrode 2 is formed on the upper surface of the other ceramic green sheet 6 so as to extend between side edges 6a and 6b of the ceramic green sheet 6 by similarly printing a conductive paste. Furthermore, an outer electrode 4 and a leading electrode 9 are formed on the lower surface of the ceramic green sheet 6 by printing conductive pastes.

In FIG. 1, the outer electrode 4 and the leading electrode 9 are illustrated in a frame represented by a broken line obtained by projecting the lower surface of the ceramic green sheet 6.

Figure 5:
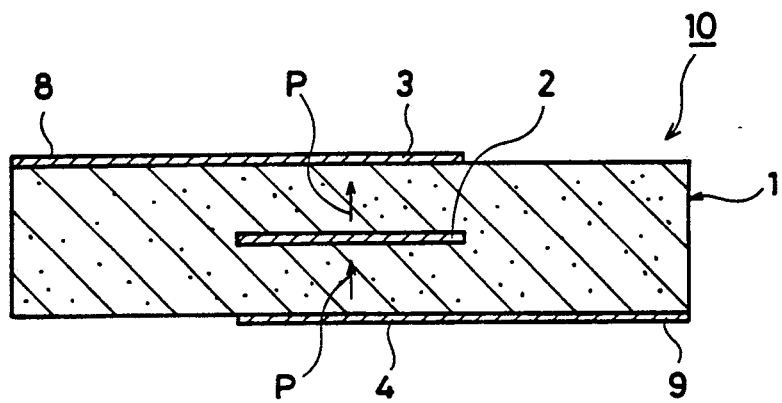
FIG. 5 is a cross sectional view illustrating the piezoelectric resonator according to the first embodiment of the present invention, which shows a cross section corresponding to a portion taken along a line V—V shown in FIG. 1.

In the fabrication, the ceramic green sheets 5 and 6 coated with the conductive pastes as described above are laminated and sintered after applying pressure to form a piezoelectric substrate 1, followed by polarization processing in the direction of the thickness of the piezoelectric substrate 1, thereby to obtain a piezoelectric resonator 10 shown in a cross sectional view in FIG. 5. In FIG. 5, arrows P indicate the direction of polarization.

In the piezoelectric resonator 10 according to the present embodiment, an inner electrode 2 is formed in a position at a height around the center of the piezoelectric substrate 1 in the direction of thickness, and the inner electrode 2 is opposed to outer electrodes 3 and 4 formed on both major surfaces of the piezoelectric substrate 1. Consequently, a second harmonic wave of the thickness-extensional vibration mode is excited by applying an AC electric field using the electrodes.

The piezoelectric resonator 10 according to the first embodiment is characterized by the plane shapes of the outer electrodes 3 and 4, which will be described with reference to FIGS. 2A and 2B.

Figure 2A:
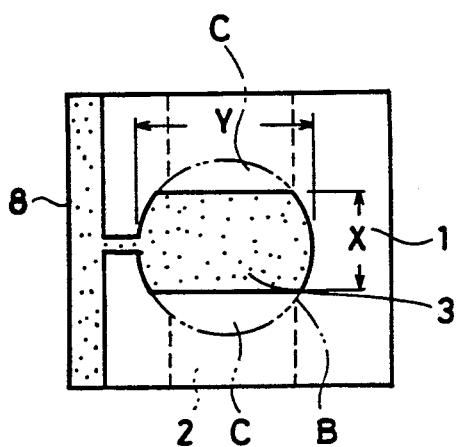
FIGS. 2A and 2B are plan views for explaining the shapes of outer electrodes.

Referring to FIG. 2A, the outer electrode 3 is in such a shape that a region C enclosed by an imaginary line is eliminated from a virtual circle B having a diameter slightly larger than the width of the inner electrode 2 whose position is indicated by a broken line. More specifically, the outer electrode 3 is formed so as to have such a shape that a part of the virtual circle B is eliminated from the virtual circle B at both its sides along the direction of the length of the inner electrode 2. Consequently, the dimension X of the outer electrode 3 in the direction of the length of the inner electrode is made smaller than the dimension Y thereof in the direction of the width of the inner electrode. As shown in FIG. 2B, the outer electrode 4 is formed in the same shape as that of the outer electrode 3.

In the piezoelectric resonator 10 according to the present embodiment, the area of each of the outer electrodes 3 and 4 is set to about 50 to 90 percent of the area of the virtual circle B. Consequently, any spurious mode which appears in the vicinity of an antiresonance point in the impedance-frequency characteristics is suppressed, which will be described with reference to FIGS. 3 and 4.

The inventors of the present application changed the shapes of the above described outer electrodes 3 and 4 so as to gradually increase the size of the region C eliminated from the virtual circle B and measured a response level of main vibration and a response level β of spurious mode vibration in the respective cases. The results are shown in FIG. 3. In FIG. 3, the axis of abscissa represents the ratio of the area of each of the outer electrodes 3 and 4 to the area of the virtual circle B. More specifically, on the abscissa shown in FIG. 3, 100 percent corresponds to a case where the outer electrodes 3 and 4 have the same shape as that of the virtual circle B. The area of the outer electrode is reduced as the size of the region C to be eliminated in FIGS. 2A and 2B becomes larger. As shown in FIG. 3, if the area of the region C to be eliminated is about 10 percent or less, that is, the area of the electrode is about 90 percent or more, the response level β of spurious mode is not sufficiently low. Consequently, it is found that the spurious mode suppressing effect is small.

If the area of each of the outer electrodes 3 and 4 is reduced by about 50 percent or more, that is, the area of the electrode is 50 percent or less, on the other hand, the main vibration is divided. Consequently, it is found that about 50 to 90 percent of the area of the virtual circle B is suitable as the area of each of the outer electrodes 3 and 4.

Figure 2B:
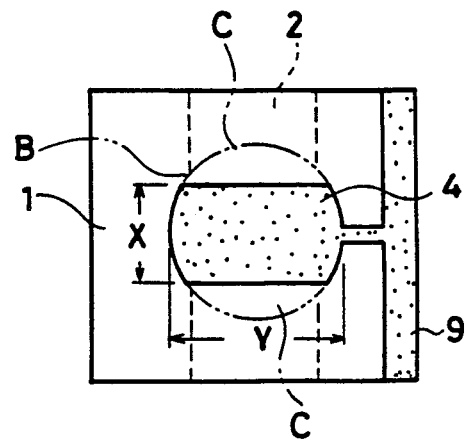
Figure 3:
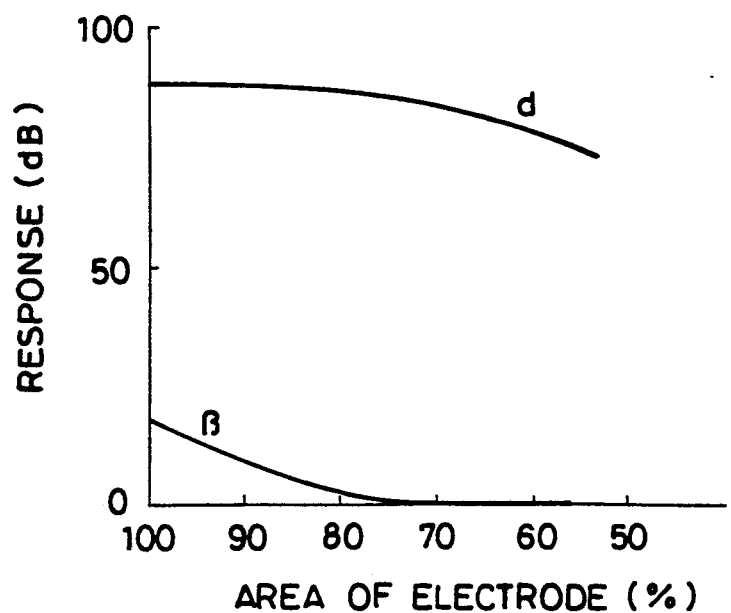
FIG. 3 is a diagram showing the relation between a response level and the area of the outer electrode of the piezoelectric resonator according to the first embodiment of the present invention.
Figure 4:
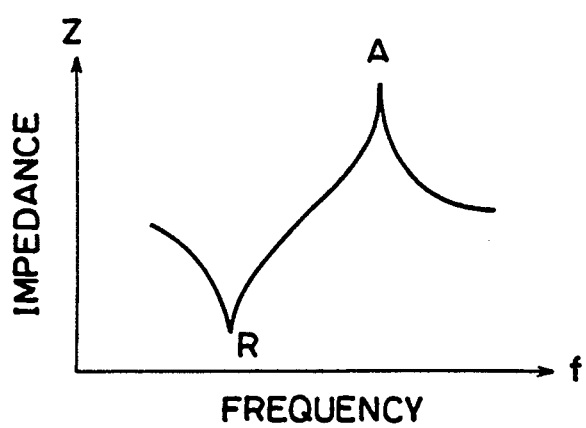
FIG. 4 is a diagram showing impedance-frequency characteristics of the piezoelectric resonator according to the first embodiment of the present invention.
Figure 8:
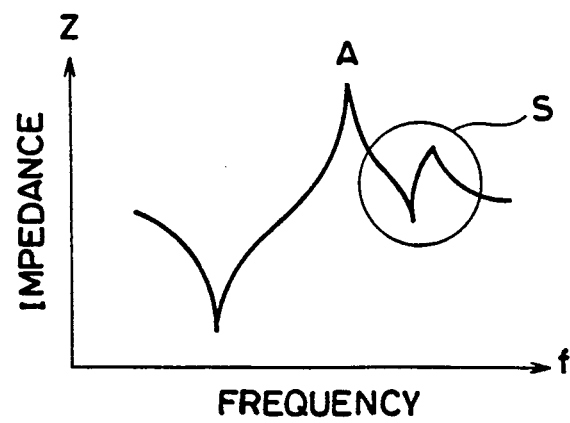
FIG. 8 is a diagram showing impedance-frequency characteristics of the conventional piezoelectric resonator shown in FIG. 7.

On the basis of the above described measurement, the area of the virtual circle B is reduced by about 10 to 50 percent thereof (that is, the region C in FIGS. 2A and 2B is eliminated by thus selecting the size thereof), the piezoelectric resonator 10 shown in FIG. 5 is fabricated and impedance-frequency characteristics thereof are measured, to obtain the results shown in FIG. 4. As can be seen from FIG. 4, the spurious mode S which appeared on the side of a slightly higher frequency region from the antiresonance point A in the impedance-frequency characteristics of the conventional piezoelectric resonator (see FIG. 8) is suppressed. More specifically, superior spurious-frequency characteristics are achieved in which no spurious mode occurs in the vicinity of a resonance point R and an antiresonance point A.

Furthermore, according to the present embodiment, the dimension Y of each of the outer electrodes 3 and 4 in the direction of the width of the inner electrode is made larger than the width of the inner electrode 2. If the width of the inner electrode 2 is larger than the dimension Y of the outer electrode in the direction of the width of the inner electrode, ripple and spurious mode vibrations are liable to occur due to the effect of the leading electrodes 8 and 9. More specifically, the dimension Y of the outer electrodes 3 and 4 in the direction of the width of the inner electrode is made larger than the width of the inner electrode 2 so as not to be affected by the leading electrodes 8 and 9.

Additionally, the area in which the inner electrode 2 and each of the outer electrodes 3 and 4 are overlapped with each other through the piezoelectric substrate 1 in the direction of the width of the inner electrode 2 significantly affects resonance characteristics. On the other hand, the overlapping of the inner electrode 2 with each of the outer electrodes 3 and 4 may be shifted in position due to an error in position where the electrode is formed and an error in lamination of the ceramic green sheets 5 and 6. According to the present embodiment, however, the dimension of each of the outer electrodes 3 and 4 in the direction of the width of the inner electrode is made larger than the width of the inner electrode 2, thereby to prevent fluctuations in the area where the inner electrode 2 and each of the outer electrodes 3 and 4 are overlapped with each other due to such a shift in position. More specifically, the width of the inner electrode 2 is made smaller than the dimension Y of each of the outer electrodes 3 and 4 in the direction of the width of the inner electrode. Accordingly, a large allowance is made for errors in the forming precision of the electrode and the laminating precision of the ceramic green sheets.

In the above described embodiment, the plane shapes of the outer electrodes 3 and 4 are made equal to each other. Accordingly, if the outer electrodes 3 and 4 are formed by printing of conductive pastes, conductive pastes for the outer electrodes 3 and 4 can be printed by only using one type of mask. The plane shapes of the outer electrodes 3 and 4, however, need not be necessarily made equal to each other.

Figure 6:
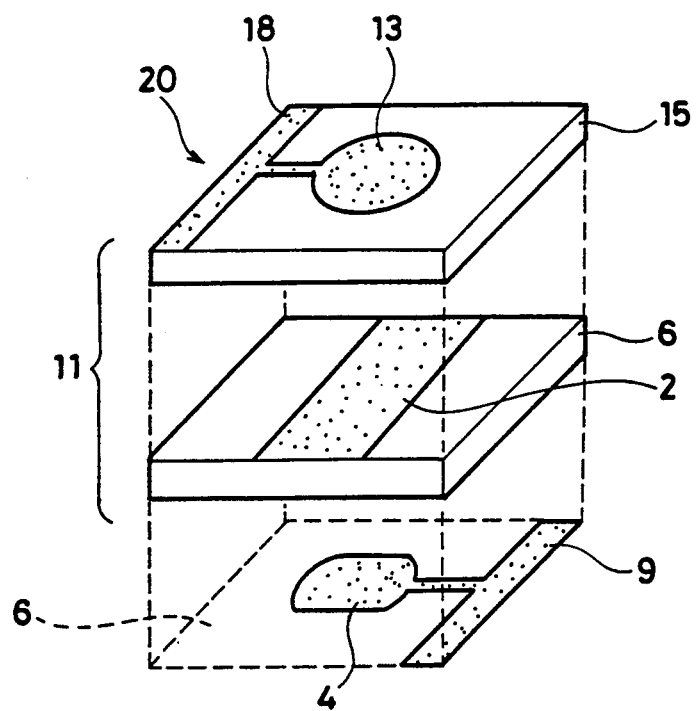
FIG. 6 is an exploded perspective view for explaining a piezoelectric resonator according to another embodiment of the present invention.
Figure 7:
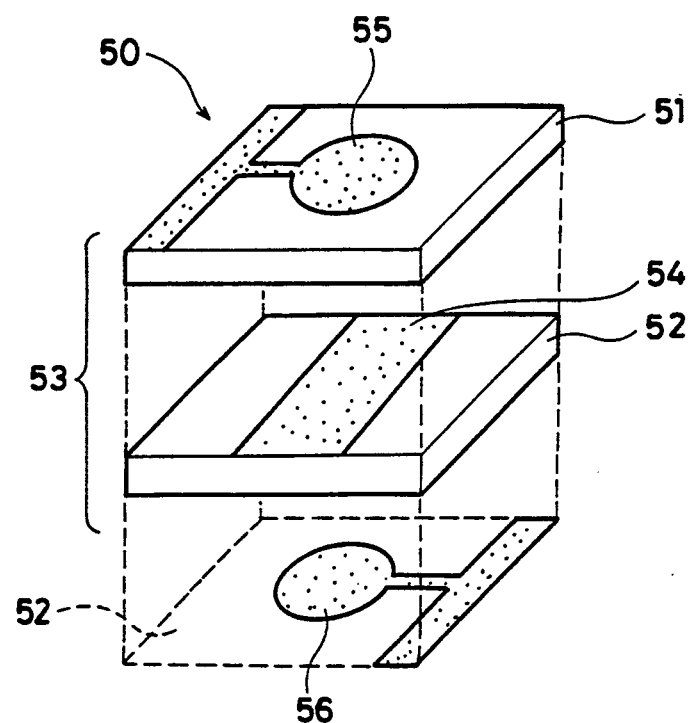
FIG. 7 is an exploded perspective view for explaining a conventional piezoctric resonator.

FIG. 6 is an exploded perspective view for explaining a piezoelectric resonator according to another embodiment of the present invention, which corresponds to FIG. 1 showing the piezoelectric resonator 10.

A piezoelectric resonator 20 according to the present embodiment is exactly the same as the piezoelectric resonator 10 shown in FIG. 1 except that an outer electrode 13 formed on one ceramic green sheet 15 for constructing the piezoelectric resonator 20 has a circular shape, that is, the outer electrode 13 is formed to be of the same size as that of the above described virtual circle B (see FIG. 2A). As shown in FIG. 6, even in a case where the outer electrode 13 is an electrode having an usual shape, that is, such a circular shape that the dimension thereof in the direction of the length of the inner electrode is equal to that in the direction of the width of the inner electrode, spurious mode which appears in the vicinity of an antiresonance point can be effectively suppressed, provided that at least one outer electrode 4 is formed similarly to that in the case of the piezoelectric resonator 10 shown in FIG. 1. More specifically, the condition that the dimension X of at least one outer electrode in the direction of the length of an inner electrode is smaller than the dimension Y thereof in the direction of the width of the inner electrode is sufficient for the present invention.

In the above described embodiments, the outer electrodes 3 and 4 are in such a shape that the region C is eliminated from the virtual circle B (see FIGS. 2A and 2B). According to the present invention, however, the shapes of the outer electrodes are not limited to such a shape. More specifically, such outer electrodes may be formed that they have such a shpae that a region having about 10 to 50 percent of the area of a polygon of size corresponding to the virtual circle B is eliminated from the polygon at both its ends in the direction of the length of the inner electrode so that the dimension thereof in the direction of the length of the inner electrode is made smaller than that in the direction of the width of the inner electrode.

Furthermore, such outer electrodes 3 and 4 having a smaller dimension in the dimension thereof in the direction of the length of the inner electrode than that in the direction of the width of the inner electrode may be formed either by forming an electrode of size corresponding to the virtual circle B and then, eliminating the region C therefrom, or by forming an electrode having such a shape that the region C is eliminated from the beginning.

Additionally, a method of forming the inner electrode 2 and the outer electrodes 3 and 4 is not limited to the above described application of conductive pastes. For example, they may be formed by suitable methods such as vacuum evaporation and sputtering.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piezoelectric resonator utilizing a second harmonic wave of the thickness-extensional vibration mode, comprising:
   a piezoelectric substrate;
   an inner electrode formed in a position at a height around the center of said piezoelectric substrate in the direction of thickness so as to extend in one direction; and
   outer electrodes formed on both major surfaces of the piezoelectric substrate so as to be opposed to said inner electrode,
   the dimension of at least one of said outer electrodes in the direction of the length of the inner electrode being smaller than the dimension of said at least one of said outer electrodes in the direction of the width of the inner electrode.

2. The piezoelectric resonator according to claim 1, wherein the dimension of each of the outer electrodes in the direction of the length of the inner electrode is smaller than the dimension of said outer electrodes in the direction of the width of the inner electrode.

3. The piezoelectric resonator according to claim 2, wherein the dimension of each of said outer electrodes in the direction of the width of the inner electrode is larger than the width of said inner electrode.

4. The piezoelectric resonator according to claim 3, wherein at least one of said outer electrodes has a shape wherein a region having 10 to 50 percent of the area of a virtual circle having a diameter slightly larger than the width of the inner electrode is eliminated from the virtual circle at both its sides in the direction of the length of the inner electrode.

5. The piezoelectric resonator according to claim 1, wherein the dimension of said at least one outer electrode in the direction of the width of the inner electrode is larger than the width of said inner electrode.

6. The piezoelectric resonator according to claim 1, wherein at least one of said outer electrodes has a shape wherein a region having 10 to 50 percent of the area of a virtual circle having a diameter slightly larger than the width of the inner electrode is eliminated from the virtual circle at both its sides in the direction of the length of the inner electrode.

7. The piezoelectric resonator according to claim 1, wherein at least one of said outer electrodes has a shape wherein a region having 10 to 50 percent of the area of a polygon having a diameter slightly larger than the width of the inner electrode is eliminated from the polygon at both its ends in the direction of the length of the inner electrode.

8. The piezoelectric resonator according to claim 5, wherein said polygon has the same area as that of a virtual circle having a diameter slightly larger than the width of the inner electrode, including said eliminated region.

9. The piezoelectric resonator according to claim 1, wherein said inner electrode is formed in a stripe shape connecting a pair of side surfaces of the piezoelectric substrate.

10. The piezoelectric resonator according to claim 9, wherein said inner electrode is exposed at both of said pair of side surfaces of the piezoelectric substrate.

* * * * *